United States Patent
Kito et al.

(10) Patent No.: US 7,084,450 B2
(45) Date of Patent: Aug. 1, 2006

(54) SEMICONDUCTOR MEMORY DEVICE AND METHOD OF MANUFACTURING THE SAME

(75) Inventors: Masaru Kito, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 10/806,398

(22) Filed: Mar. 23, 2004

(65) Prior Publication Data

US 2005/0127424 A1    Jun. 16, 2005

(30) Foreign Application Priority Data

Dec. 15, 2003    (JP) .............................. 2003-416183

(51) Int. Cl.
   *H01L 27/108*    (2006.01)
   *H01L 29/76*    (2006.01)
(52) U.S. Cl. ...................................... 257/301; 257/300
(58) Field of Classification Search ................ 257/300, 257/301, 311
   See application file for complete search history.

(56) References Cited

U.S. PATENT DOCUMENTS 6,310,375 B1 * 10/2001 Schrems .................... 257/301
6,515,327 B1 * 2/2003 King .......................... 257/304

FOREIGN PATENT DOCUMENTS

| JP | 10-321813 | 12/1998 |
| JP | 11-26707 | 1/1999 |
| JP | 2001-345433 | 12/2001 |
| JP | 2002-118240 | 4/2002 |
| JP | 2003-282734 | 10/2003 |

* cited by examiner

*Primary Examiner*—Phat X. Cao
*Assistant Examiner*—Theresa T. Doan
(74) *Attorney, Agent, or Firm*—Oblon, Spivak, McClelland, Maier & Neustadt, P.C.

(57) ABSTRACT

A semiconductor memory device includes an element region and an element-isolating region provided on a semiconductor substrate, a capacitor formed in a trench, a first insulating film formed on a side surface of the trench on the capacitor, a first conductive layer provided on the first insulating film and the capacitor so as to bury the trench, a second insulating film provided on a side surface of the trench and on the first insulating film and on both side surfaces of the element region, a gate electrode provided on the element region through a gate insulating film, a source region and a drain region provided in the element region, and a contact layer provided on the first conductive layer and the element region to connect the first conductive layer with the source region or the drain region.

11 Claims, 14 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2003-416183, filed Dec. 15, 2003, the entire contents of which are incorporated herein by reference.

BACKGROUND OF THE INVENTION

1. Field of the Invention

This invention relates to a semiconductor memory device and a method of manufacturing the same. In particular, this invention relates to a structure of a semiconductor memory device having a trench capacitor in a memory cell, and a method of manufacturing the same.

2. Description of the Related Art

The integration density of semiconductor integrated circuits has become higher and higher in recent years. In particular, DRAMs (Dynamic Random Access Memory) have made remarkable progress in this respect. To achieve higher integration density in a DRAM cell having 1 transistor and 1 capacitor, it is required to microminiaturize the parts. With micro-miniaturization of a DRAM cell, a source diffusion layer (or drain diffusion layer) of a transistor of the cell is also reduced.

A DRAM using a trench capacitor as a capacitor forming a DRAM cell is known. Further, as a strap contact for connecting a source region of a memory cell transistor and an electrode of a trench capacitor, which form a DRAM cell, used is a BS (Buried Strap) contact layer. The BS contact layer is formed to be buried in a semiconductor substrate on which the DRAM cell is formed.

However, with microminiaturization of DRAM cells, the volume of a BS contact layer is reduced. This causes increase in the resistance value of the BS contact layer. As a method of solving this problem, it is one choice to adopt an SS (Surface Strap) contact layer forming a strap contact layer on a surface of the semiconductor substrate. An example of the structure of a DRAM having an SS contact layer is explained below. FIG. 31 is a cross-sectional view of a main part of a conventional DRAM.

In a semiconductor substrate 1, a trench 2 is formed. A plate electrode 3 formed of an N type diffusion layer for a capacitor electrode is provided around a lower portion of the trench 2, in the semiconductor substrate 1. An NO film 4 (formed of a silicon nitride film and a silicon oxide film) being a dielectric film of a capacitor is provided on an inner surface of the lower portion of the trench 2. A polysilicon layer 5 serving as an electrode of the capacitor is provided on the NO film 4 in the trench 2. On the inner surface of the trench 2 above the polysilicon layer 5, a color oxide film 6 is provided to electrically insulate the plate electrode 3 from a source or a drain diffusion layer of a memory cell transistor formed on the semiconductor substrate 1. In the trench 2, a polysilicon layer 7 being a wiring layer for contact with the polysilicon layer 5 is provided on the color oxide film 6. A element-isolating region 8 is provided in the surface of the semiconductor substrate 1, to electrically separate the device from the adjacent device.

On the semiconductor substrate 1, provided is a memory cell transistor having a gate insulating film 9, a polysilicon gate electrode layer 10, a WSi gate electrode layer 11, a gate cap insulating film 12, a gate side wall insulating film 13, a source diffusion layer 14 and a drain diffusion layer 15. Further, on the element-isolating region 8, provided is a pass word-line having a polysilicon gate electrode layer 16, a WSi gate electrode layer 17, a gate cap insulating film 18 and a gate side wall insulating film 19. An SS contact layer 40 serving as a contact layer between the polysilicon layer 7 and the source diffusion layer 14 is provided on the polysilicon layer 7 and the source diffusion layer 14.

If the SS contact layer 40 shown in FIG. 31 is formed, an oxide film (Trench Top Oxide, hereinafter referred to as "TTO") formed on the trench capacitor (specifically, polysilicon layer 7) is etched back and thereby the polysilicon layer 7 serving as a wiring layer is exposed. Then, polysilicon serving as the SS contact layer 40 is deposited on the polysilicon layer 7. In such a case, in etchback of the TTO, the color oxide film 6 and the element-isolating region 8 are undesirably etched back, too.

Depositing polysilicon for the SS contact layer 40 in this state produces a structure where the SS contact layer 40 contacts also on the side surface of the active region on which the memory cell transistor is formed. This causes diffusion of impurities from the SS contact layer 40 to the active region, and undesirably increases junction depth of the source diffusion layer 14 of the memory cell transistor. This causes deterioration of the property of the memory cell transistor.

Further, if the color oxide film 6 and the element-isolating region 8 are deeply etched, the junction depth is further increased, and the property of the memory cell transistor is further deteriorated. Such a problem becomes more obvious with size reduction in the design rule.

As related art of this kind, disclosed is a technique of reducing the resistance of a buried strap (refer to Jpn. Pat. Appln. KOKAI Pub. No. 2003-282734).

BRIEF SUMMARY OF THE INVENTION

According to a first aspect of the present invention, there is provided a semiconductor memory device including: a semiconductor substrate; an element region provided on the semiconductor substrate; an element-isolating region provided around the element region and on the semiconductor substrate; a trench provided in the semiconductor substrate, the trench contacting the element region; a capacitor having a first electrode provided in the semiconductor substrate and a second electrode provided in the trench; a first insulating film provided on a side surface of the trench and on the capacitor; a first conductive layer provided on the first insulating film and the second electrode so as to bury the trench; a second insulating film provided on a side surface of the trench and on the first insulating film, and provided on both side surfaces of the element region; a gate electrode provided on the element region through a gate insulating film; a source region and a drain region provided in the element region on both sides of the gate electrode; and a contact layer provided on the first conductive layer and the element region so as to connect the first conductive layer with the source region or the drain region.

According to a second aspect of the present invention, there is provided a method of manufacturing a semiconductor memory device including: forming a trench in a semiconductor substrate; forming a capacitor having a first electrode provided in the semiconductor substrate and a second electrode provided in the trench; forming a first insulating film on a side surface of the trench and on the capacitor; forming a first conductive layer on a side surface of the first insulating film and on the second electrode so as to bury the trench; forming an element-isolating region on the semiconductor substrate and around an element region in which a transistor is to be formed; forming a gate electrode on the element region through a gate insulating film; forming a source region and a drain region in the element region on both sides of the gate electrode; etching an insulating film formed on the first conductive layer; forming a second insulating film on a side surface of the trench and on the first insulating film, and on both side surfaces of the element region; and forming a contact layer on the first conductive layer and the element region so as to connect the first conductive layer with the source region or the drain region.

According to a third aspect of the present invention, there is provided a method of manufacturing a semiconductor memory device including: forming a trench in a semiconductor substrate; forming a capacitor having a first electrode provided in the semiconductor substrate and a second electrode provided in the trench; forming a first insulating film on a side surface of the trench and on the capacitor; forming a first conductive layer on the first insulating film and the second electrode so as to bury the trench; forming an element-isolating region on the semiconductor substrate and around an element region in which a transistor is to be formed; forming a gate electrode on the element region through a gate insulating film; forming a source region and a drain region in the element region on both sides of the gate electrode; forming an insulating layer on the element region and the element-isolating region; etching the insulating layer formed on a region in which a contact layer connecting the first conductive layer with the source region or the drain region is to be formed; etching an insulating film formed on the first conductive layer; forming a second insulating film on a side surface of the trench and on the first insulating film, and on both side surfaces of the element region; and forming the contact layer on the first conductive layer and the element region.

DETAILED DESCRIPTION OF THE INVENTION

Figure 1:
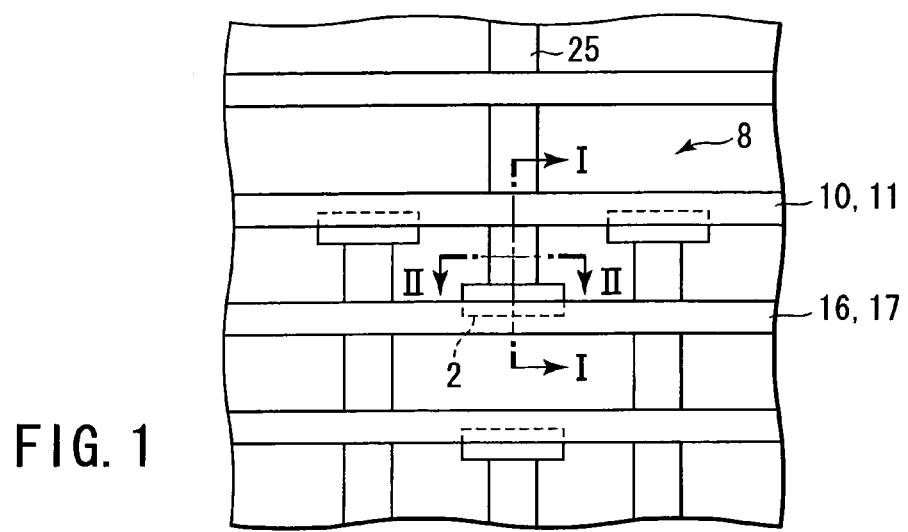
FIG. 1 is a layout diagram of a semiconductor memory device according to a first embodiment of the present invention.

Embodiments of the present invention will now be described with reference to drawings. In the following explanation, constituent elements having like functions and structures are denoted by like reference numerals, and explanations thereof are repeated only when necessary.

(First Embodiment)

Figure 2:
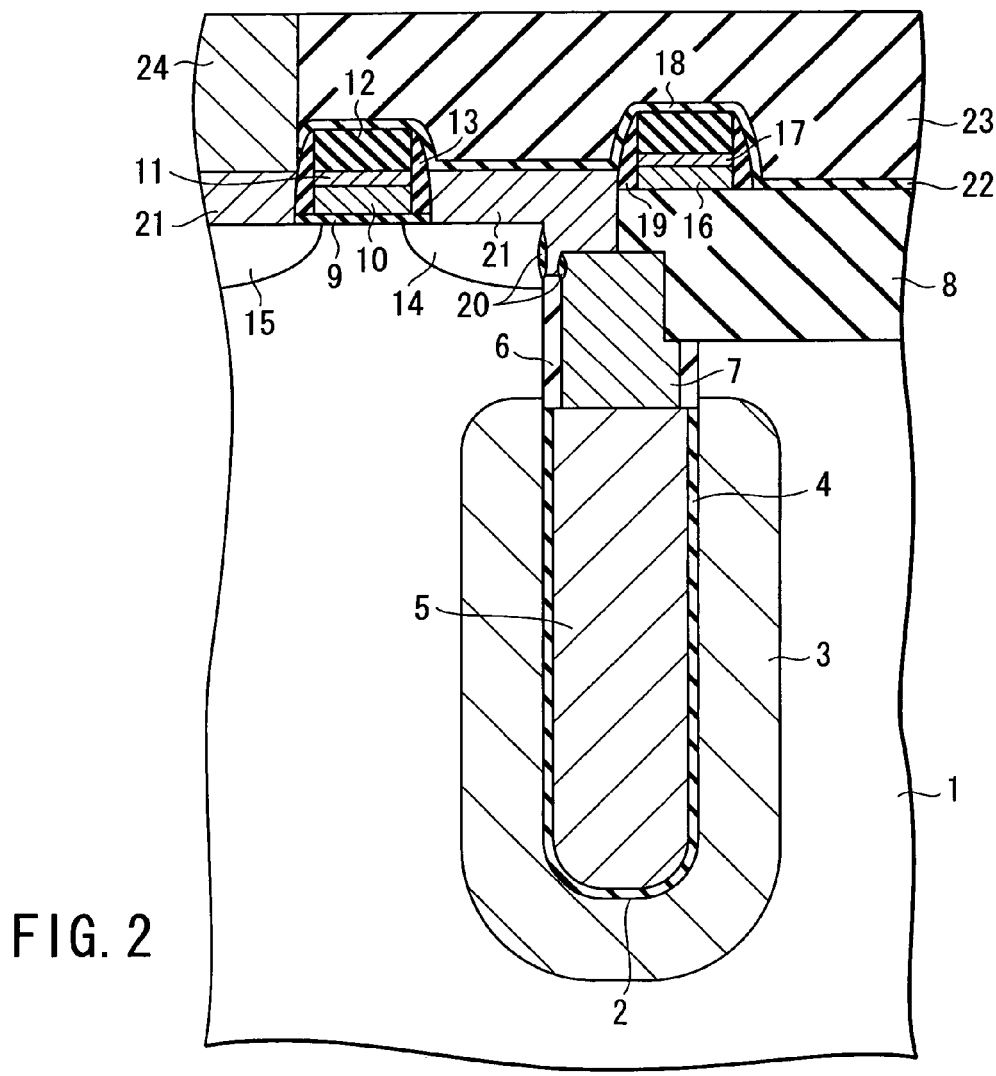
FIG. 2 is a cross-sectional view of the semiconductor device, taken along I—I line in FIG. 1.
Figure 3:
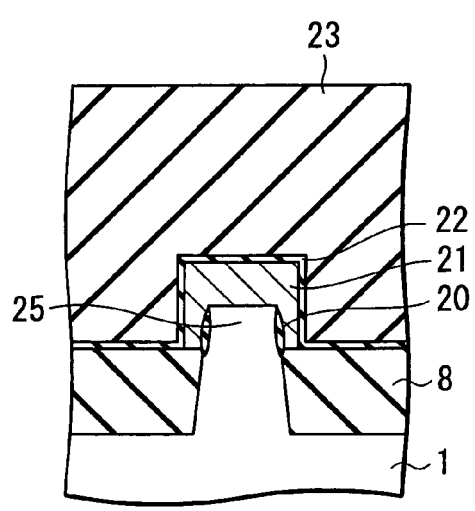
FIG. 3 is a cross-sectional view of the semiconductor device, taken along II—II line in FIG. 1.

FIG. 1 is a layout diagram of a semiconductor memory device according to a first embodiment of the present invention. FIG. 2 is a cross-sectional view of the semiconductor memory device, taken along I—I line in FIG. 1. FIG. 3 is a cross-sectional view of the semiconductor memory device, taken along I—I line in FIG. 1. FIG. 1 is a diagram for explaining positions of the cross-sections shown in FIGS. 2 and 3, thus shows a simplified structure.

In FIG. 1, on a semiconductor substrate 1, formed are an active region 25 in which a memory cell transistor and the like are formed, and an element-isolating region 8. A gate electrode (polysilicon gate electrode layer 10 and a WSi gate electrode layer 11) is formed on the active region 25. Further, in the semiconductor substrate 1, a trench 2 is formed so as to be in contact with the active region 25, and a trench capacitor is formed in the trench.

In FIG. 2, the trench 2 is formed in the semiconductor substrate 1 formed of silicon or the like. In the semiconductor substrate 1, a plate electrode 3 formed of an N type diffusion layer for a capacitor electrode is formed around a lower portion of the trench 2. On an inner surface of the lower portion of the trench 2, a silicon nitride film, for example, is formed in contact with the plate electrode 3. Further, a silicon oxide film is formed on the surface of the silicon nitride film, and the films form an NO film 4 being a dielectric film of the capacitor.

A polysilicon layer 5 serving as an electrode of the capacitor is provided on the NO film 4 in the trench 2. The polysilicon layer 5 is formed by burying As-doped amorphous silicon into the trench. On a side surface of an upper portion of the trench 2 and on the polysilicon layer 5, a color oxide film 6 is provided to electrically insulate the plate electrode 3 from a source or a drain diffusion layer of the memory cell transistor formed on the semiconductor substrate 1. In the trench 2, polysilicon layer 7 being a wiring layer for contact with the polysilicon layer 5 is provided on the color oxide film 6. The polysilicon layer 7 is formed by burying As-doped amorphous silicon into the trench 2.

A thermal oxide film 20 is provided on the side surface of the trench 2 above the color oxide film 6, on a side surface of the polysilicon layer 7 above the color oxide film 6, and on both side surfaces of the active region 25 above the element-isolating region 8. The element-isolating region 8 is provided on and adjacent to the surface of the semiconductor substrate 1, to electrically separate the element from the adjacent element.

The polysilicon gate electrode layer 10 is provided on the semiconductor substrate 1 (specifically, active region 25), through a gate insulating film 9. The WSi gate electrode layer 11 is provided on the polysilicon gate electrode layer 10. A gate cap insulating film 12 is provided on the WSi gate electrode layer 11. A gate side wall insulating film 13 formed of SiN, for example, is provided on the both side surfaces of the polysilicon gate electrode layer 10 and the WSi gate welectrode layer 11. A source diffusion layer 14 and a drain diffusion layer 15 are formed in the semiconductor substrate 1 on both sides of the polysilicon gate electrode layer 10. The memory cell transistor is formed as described above.

Further, a pass word-line is provided-on the element-isolating region 8. The pass word-line comprises a polysilicon gate electrode layer 16, a WSi gate electrode layer 17, a gate cap insulating film 18, and a gate side wall insulating film 19.

An SS contact layer 21 being a contact layer between the polysilicon layer 7 and the source diffusion layer 14 is provided on the polysilicon layer 7 and the active region 25. The SS contact layer 21 is formed by burying As-doped amorphous silicon, for example. A SS contact layer 21 is also formed on the drain diffusion layer 15. A contact 24 for connecting the drain diffusion layer 15 and a bit line (not shown) is provided on the contact 21 located on the drain diffusion layer 15.

A barrier film 22 formed of SiN, for example, is formed on the SS contact layer 21, the memory cell transistor, the pass word-line and the element-isolating region 8. The barrier film 22 is provided as a protective film in etching performed for providing the contact 24, and to prevent influence of diffusion due to heat treatment of BPSG described below. A first interlayer film 23 formed of BPSG (Boron Phospho Silicate Glass), for example, is provided on the barrier film 22. The first interlayer film 23 has flowability by heat treatment, and is provided to improve burying property of interlayer films. A second interlayer film (not shown) formed of TEOS (Tetra-Ethyl-Ortho-Silicate), for example, is provided on the first interlayer film 23. As described above, the semiconductor memory device shown in FIG. 2 is structured.

Next, a manufacturing method of the semiconductor device shown in FIG. 2 is explained with reference to FIGS. 4 to 18. FIGS. 4–7, 9, 11, 13, 15 and 17 are cross-sectional views taken along I—I line in FIG. 1. FIGS. 8, 10, 12, 14, 16 and 18 are cross-sectional views taken along II—II line in FIG. 1.

Figure 4:
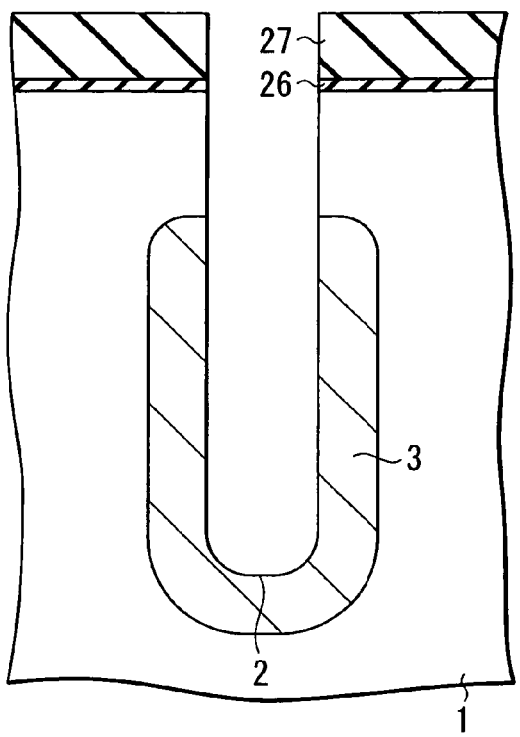
FIG. 4 is a cross-sectional view taken along the I—I line for explaining a manufacturing method of the semiconductor memory device shown in FIG. 2.

In FIG. 4, a silicon oxide film 26 having a film thickness of about 20 Å is formed on the semiconductor substrate 1. A silicon nitride film 27 having a film thickness of about 2200 Å is formed on the silicon oxide film 26. Next, the trench 2 is formed to reach the semiconductor substrate 1. The trench 2 is formed by using, for example, photolithography and dry etching, so as to have an opening of a predetermined size and depth.

Next, the plate electrode 3 is formed by diffusing an N type impurity (for example, As) in the semiconductor substrate 1. Specifically, As-doped silicate glass is deposited in the trench 2. Then, the substrate is annealed at a high temperature of at least 1000° C., to diffuse As in the semiconductor substrate 1. Thereby, the plate electrode 3 is formed. Then the silicate glass in the trench 2 is removed. The plate electrode 3 is formed to bury a lower portion of the trench 2, which ranges from a position of 1.5 μm depth from the surface of the semiconductor substrate 1 to the bottom of the trench 2.

Figure 5:
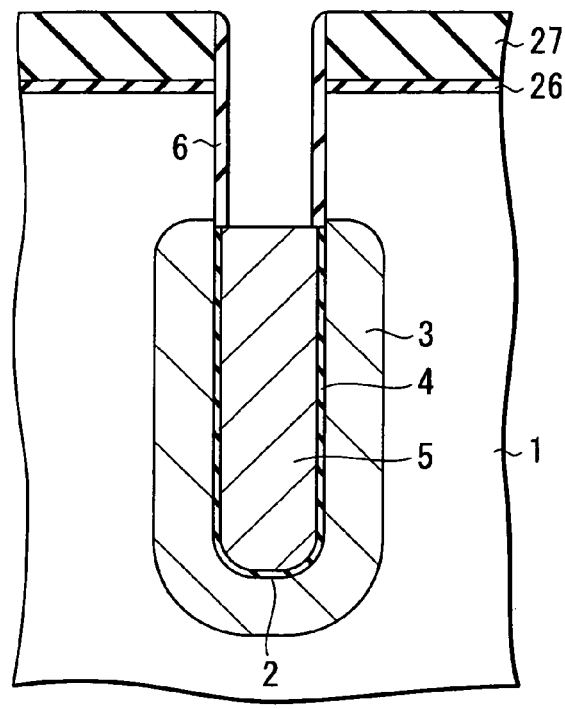
FIG. 5 is a cross-sectional view taken along the I—I line for explaining the manufacturing method, following FIG. 4.

Next, in FIG. 5, the NO film 4 being a dielectric film of the trench capacitor and having a film thickness of about 20–30 Å is formed on the inner surface of the lower portion of the trench 2. Specifically, a silicon nitride film is formed by nitriding the semiconductor substrate 1 inside the trench 2 thin, and the surface of the silicon nitride film is oxidized thin. Thereby, the NO film 4 is formed on the semiconductor substrate 1 being the inner surface of the trench 2. Next, the polysilicon layer 5 serving as an electrode of the trench capacitor is formed. The polysilicon layer 5 is formed by depositing As-doped amorphous silicon on the NO film 4. Then, after the polysilicon layer 5 is etched back to about a 1.0 μm depth from the surface of the semiconductor substrate 1, the exposed NO film 4 on the inner surface of the trench 2 is removed by wet etching or the like. Next, the color oxide film 6 having a film thickness of about 300 Å is deposited on the side surface of the trench 2 and on the polysilicon layer 5.

Figure 6:
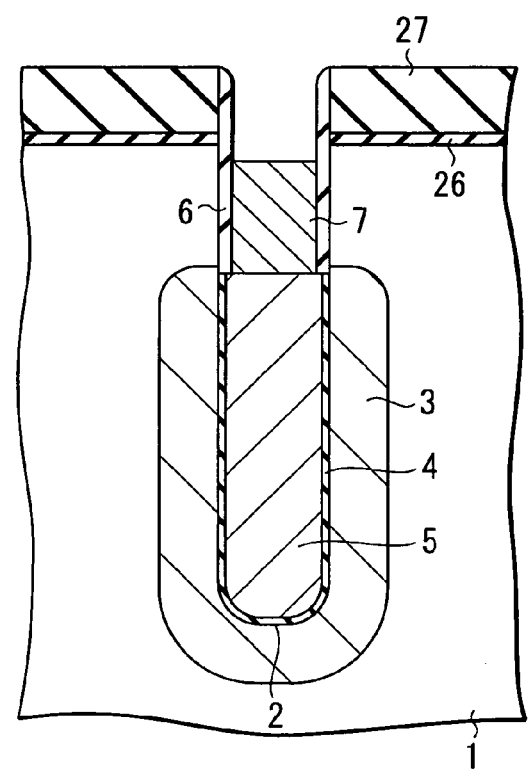
FIG. 6 is a cross-sectional view taken along the I—I line for explaining the manufacturing method, following FIG. 5.

Next, in FIG. 6, in the trench 2, the polysilicon layer 7 is formed by depositing As-doped amorphous silicon on the color oxide film 6 and the polysilicon layer 5. Then, the polysilicon layer 7 is etched back to a position close to the surface of the semiconductor substrate 1.

Figure 7:
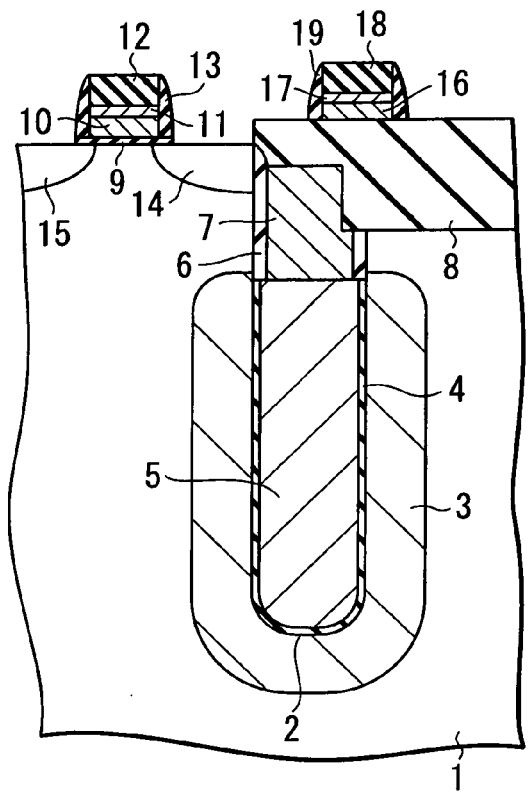
FIG. 7 is a cross-sectional view taken along the I—I line for explaining the manufacturing method, following FIG. 6.
Figure 8:
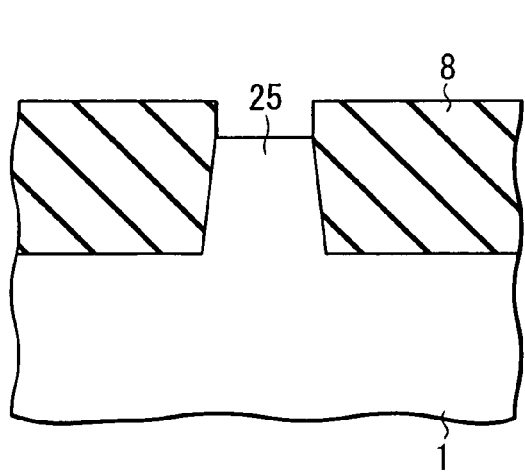
FIG. 8 is a cross-sectional view taken along the II—II line for explaining the manufacturing method, following FIG. 6.

Next, in FIGS. 7 and 8, a photoresist (not shown) for forming STI (Shallow Trench Isolation) is formed by photolithography in a region in which the element-isolating region 8 is to be formed. Thereafter, with the photoresist used as a mask, the color oxide film 6, the polysilicon layer 7 and the semiconductor substrate 1 in the region in which the element-isolating region 8 is to be formed are removed by etching. Further, the element-isolating region 8 is formed by burying an insulating film (for example, a silicon oxide film) in a device separating groove. This region electrically separates the element from the adjacent element. Next, the silicon nitride film 26, the silicon nitride film 27 and the color oxide film 6 above the surface of the semiconductor substrate 1 are removed by etching. Thereafter, the transistor is formed by a conventional process.

Figure 9:
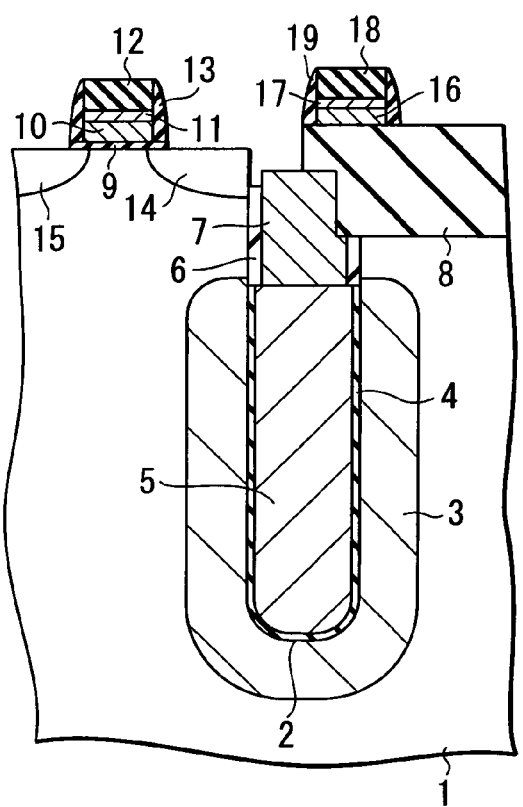
FIG. 9 is a cross-sectional view taken along the I—I line for explaining the manufacturing method, following FIG. 7.
Figure 10:
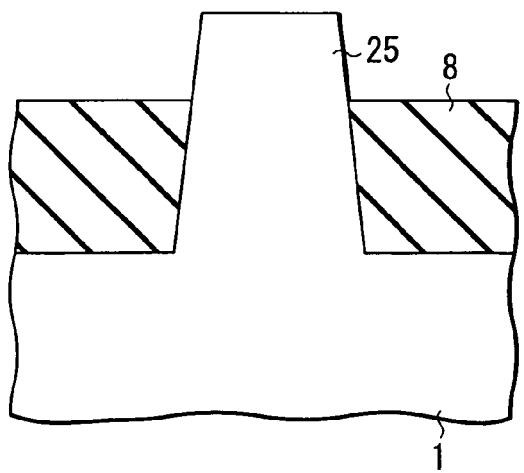
FIG. 10 is a cross-sectional view taken along the II—II line for explaining the manufacturing method, following FIG. 8.

Next, in FIGS. 9 and 10, the TTO being oxide film formed on the trench capacitor (specifically, the polysilicon layer 7) is removed by etching. In this step, over etching is performed in consideration of positional variations in level of the upper portion of the polysilicon layer 7 and variation in film thickness of the TTO. As shown in FIG. 10, by the TTO etching, the element-isolating region 8 on the side surfaces of the active region 25 is etched to the same position as that of the upper surface of the color oxide film 6.

Figure 11:
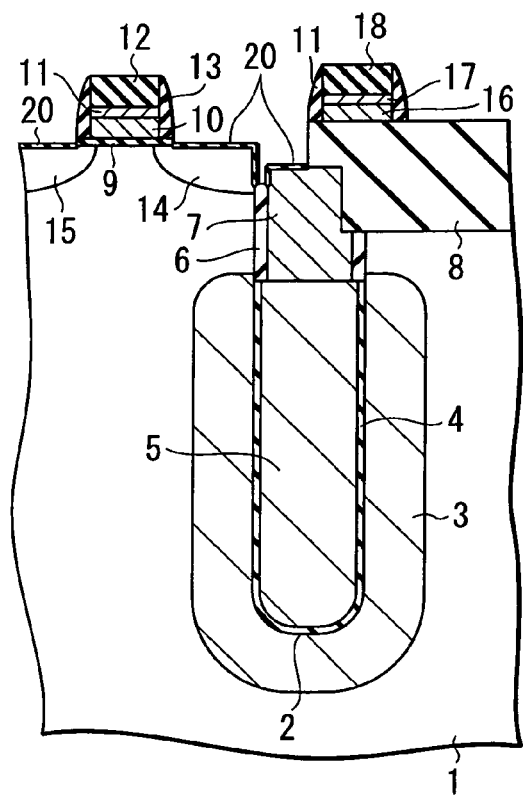
FIG. 11 is a cross-sectional view taken along the I—I line for explaining the manufacturing method, following FIG. 9.
Figure 12:
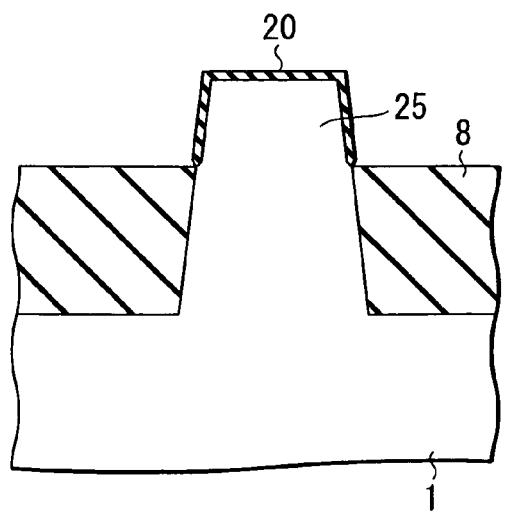
FIG. 12 is a cross-sectional view taken along the II—II line for explaining the manufacturing method, following FIG. 10.

Next, in FIGS. 11 and 12, the semiconductor substrate 1 is oxidized by thermal oxidation (for example, at 900° C., atmosphere $O_2$). This selectively forms thermal oxide films 20 (with a film thickness of about 100 Å) only on silicon-exposed portions of the side surfaces of the active region 25, the surface of the semiconductor substrate 1 and the polysilicon layer 7.

Figure 13:
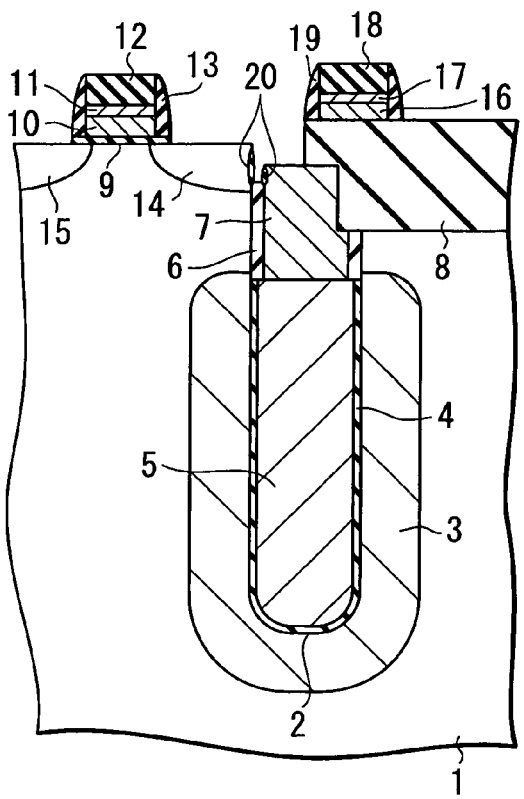
FIG. 13 is a cross-sectional view taken along the I—I line for explaining the manufacturing method, following FIG. 11.
Figure 14:
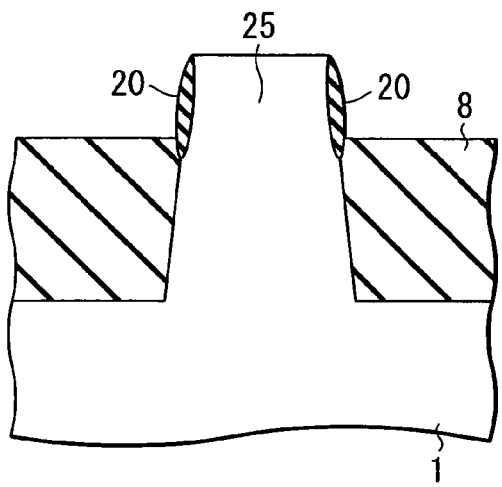
FIG. 14 is a cross-sectional view taken along the II—II line for explaining the manufacturing method, following FIG. 12.

Then, in FIGS. 13 and 14, the thermal oxide films 20 on the surface of the semiconductor substrate 1 are removed by anisotropic etching, such as RIE (Reactive Ion Etching). In this process, the thermal oxide films 20 on the side surfaces of the active region 25 are not etched but remain.

Figure 15:
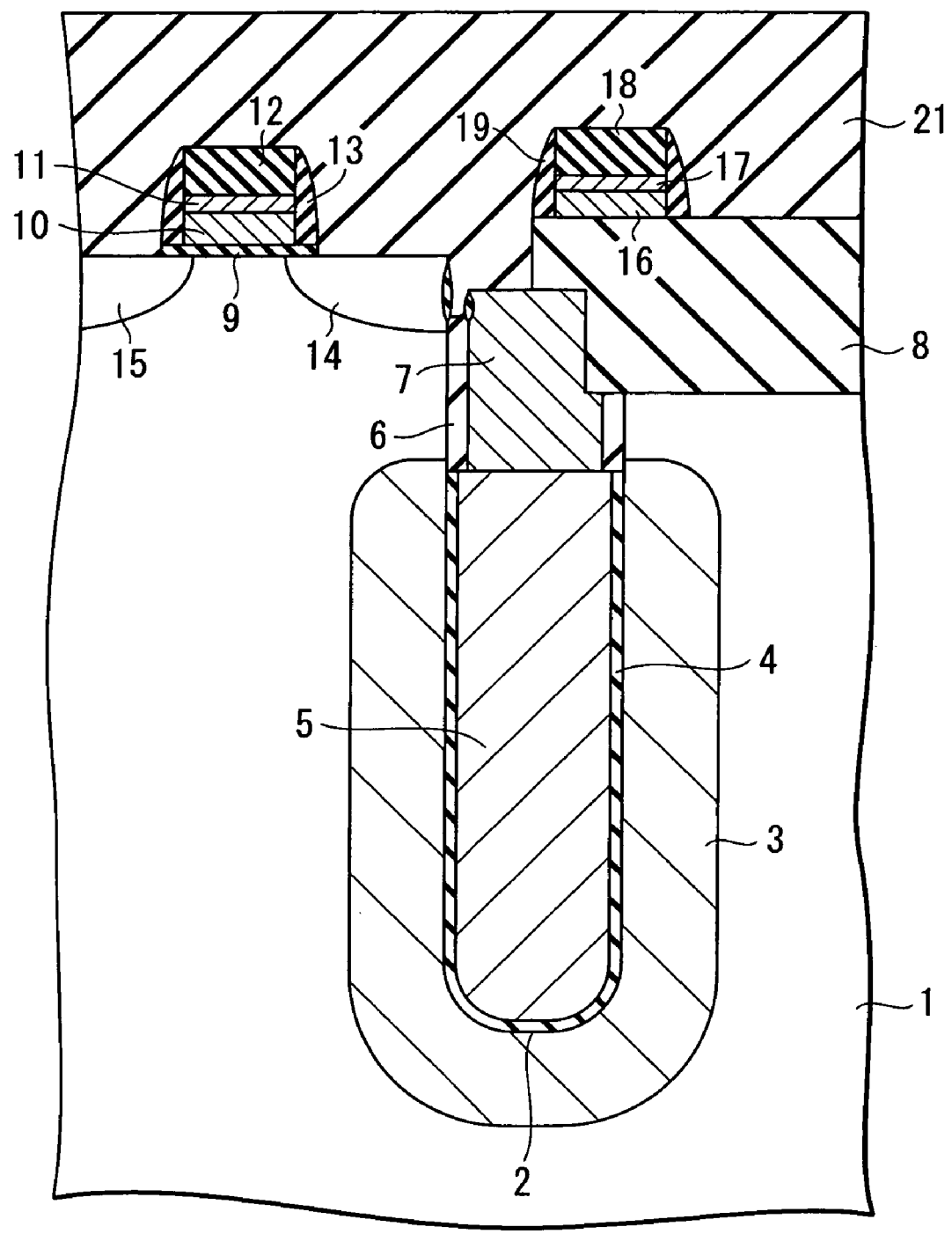
FIG. 15 is a cross-sectional view taken along the I—I line for explaining the manufacturing method, following FIG. 13.
Figure 16:
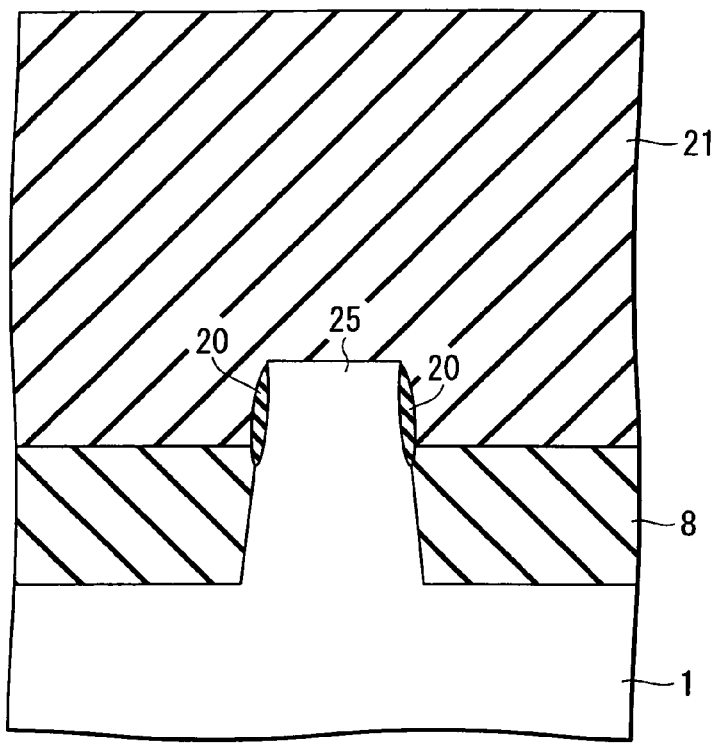
FIG. 16 is a cross-sectional view taken along the II—II line for explaining the manufacturing method, following FIG. 14.

Next, in FIGS. 15 and 16, the natural oxide film on the surface of the semiconductor substrate 1 and the upper portion of the polysilicon layer 7 is removed by etching. Next, As-doped amorphous silicon (SS contact layer 21) is deposited on the polysilicon layer 7 and the source diffusion layer 14. The step of removing the natural oxide film is not necessarily required if the semiconductor substrate 1 and the SS contact 21 are in ohmic contact. If the natural oxide film is removed by using a chemical solution such as dilute hydrofluoric acid, etching is performed under such conditions that the thermal oxide films 20 on the side surfaces of the active region 25 are not entirely removed (for example, etching amount of the thermal oxide films 20 is about 25 Å).

Figure 17:
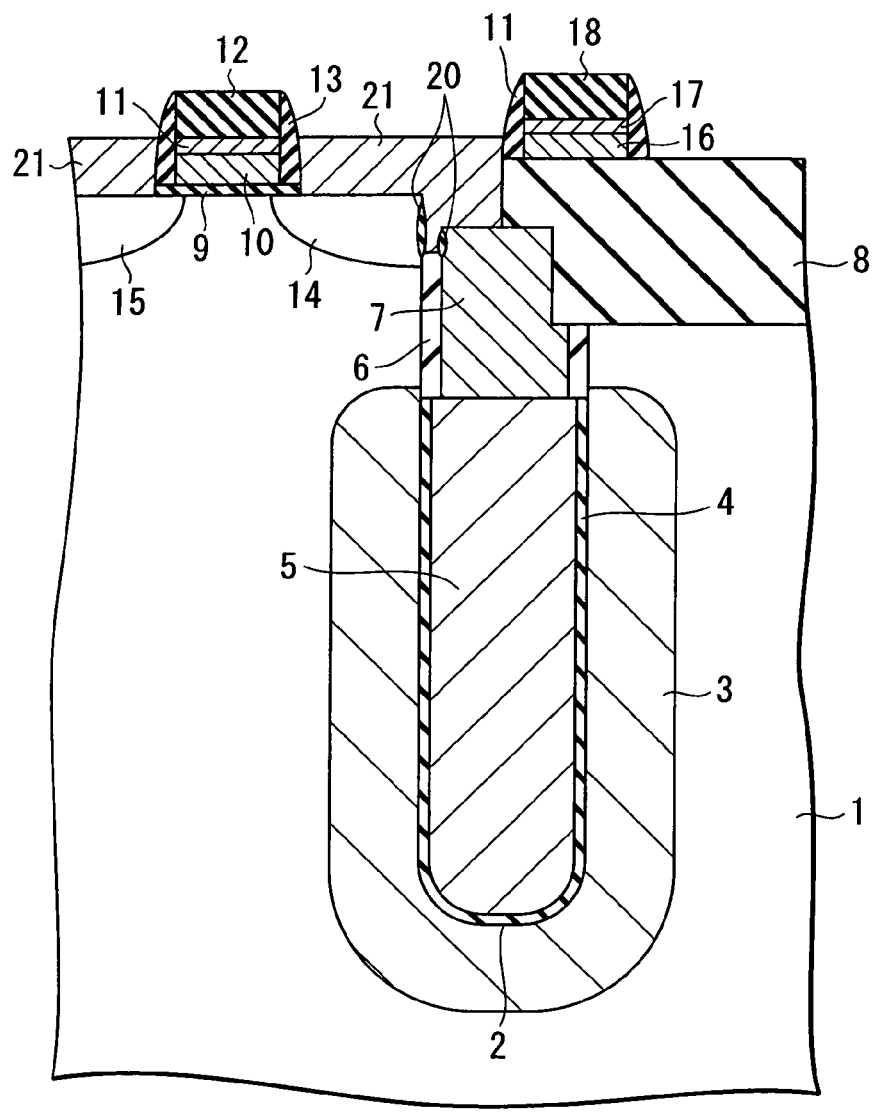
FIG. 17 is a cross-sectional view taken along the I—I line for explaining the manufacturing method, following FIG. 15.
Figure 18:
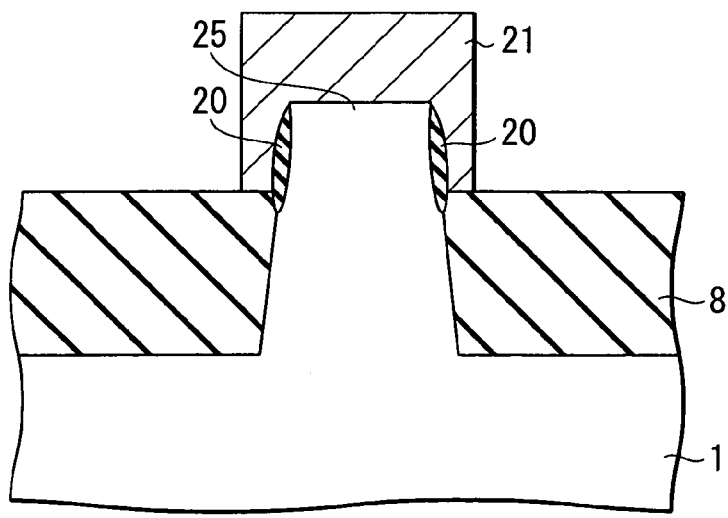
FIG. 18 is a cross-sectional view taken along the II—II line for explaining the manufacturing method, following FIG. 16.

Next, in FIGS. 17 and 18, the surface of the SS contact layer 21 is planarized by CMP (Chemical Mechanical Polishing), and etched by RIE until the film thickness of the SS contact layer 21 is reduced to 2000 Å (as high as the middle portion of the gate cap insulating film 12). Then, the SS contact layer 21 having a desired shape is formed by photolithography. Specifically, a photoresist having the same shape as the desired shape of the SS contact layer 21 is coated thereon, and the SS contact layer 21 is etched by RIE with the photoresist used as a mask.

Next, as shown in FIGS. 2 and 3, the barrier film 22 (film thickness of about 80 Å) formed of SiN is deposited on the whole surface of the semiconductor substrate 1. The first interlayer film 23 (film thickness of about 3700 Å) formed of BPSG is deposited on the barrier film 22, and the surface of the film is planarized by CMP. The second interlayer film (film thickness of about 1500 Å) (not shown) formed of TEOS is deposited on the first interlayer film 23 and planarized. Then, the contact 24 and contacts for peripheral circuits are formed, and further a wiring layer (not shown) is formed. Thereby, the semiconductor memory device shown in FIG. 2 is formed.

The semiconductor memory device formed as described above has the thermal oxide films 20 only on the side surfaces of the active region 25 and the side surface of the trench 2. This can restrict the contact part between the SS contact layer 21 and the active region 25 to only the upper surface of the active region 25. This structure can prevent diffusion of impurities from the SS contact layer 21 to the side surfaces of the active region 25, and thus can suppress increase in the junction depth of the source diffusion layer 14 of the memory cell transistor.

Further, the thermal oxide films 20 are formed by thermal oxidation. Therefore, no thermal oxide film 20 is formed on the side surfaces of the gate side wall insulating film 13, and thus reduction in the volume of the SS contact layer 21 can be suppressed. This can prevent increase in the resistance value of the SS contact layer 21.

As detailed above, in this embodiment, the thermal oxide films 20 are formed only on the side surfaces of the active region 25, and thereafter the SS contact layer 21 is formed.

Therefore, according to the embodiment, diffusion of impurities from the SS contact layer 21 to the side surfaces of the active region 25 is prevented, and thereby increase in the junction depth of the diffusion layer of the memory cell transistor can be suppressed. Thereby, deterioration in the property of the memory cell transistor can be prevented.

Further, the thermal oxide films 20 are not formed on the side surfaces of the gate electrode, the volume of the SS contact layer 21 is not reduced. Therefore, it is possible to prevent increase in the resistance value of the SS contact layer 21. This has a more remarkable effect in devices microminiaturized with the design rule.

The semiconductor memory device of this embodiment has the barrier film 22 formed of SiN. By adopting this structure, when the interlayer film is etched to provide a contact, the oxide film formed under the barrier film. 22 is protected. Further, it is possible to suppress the influence of diffusion due to heat treatment of BPSG.

The semiconductor memory device of this embodiment also has the first interlayer film 23 formed of BPSG. This increases the burying property of the interlayer films.

In the present embodiment, thermal oxide film is used as the oxide film formed on the side surfaces of the active region 25. However, oxide film of another kind may be used, as long as it is not removed simultaneously with removal of the natural oxide film on the upper portion of the polysilicon layer 7. Specifically, any oxide film having a selective ratio (a ratio of etching speed) different from that of the natural oxide film may be used. Such an oxide film can also be used to form an oxide film only on the side surfaces of the active region 25.

(Second Embodiment)

Figure 19:
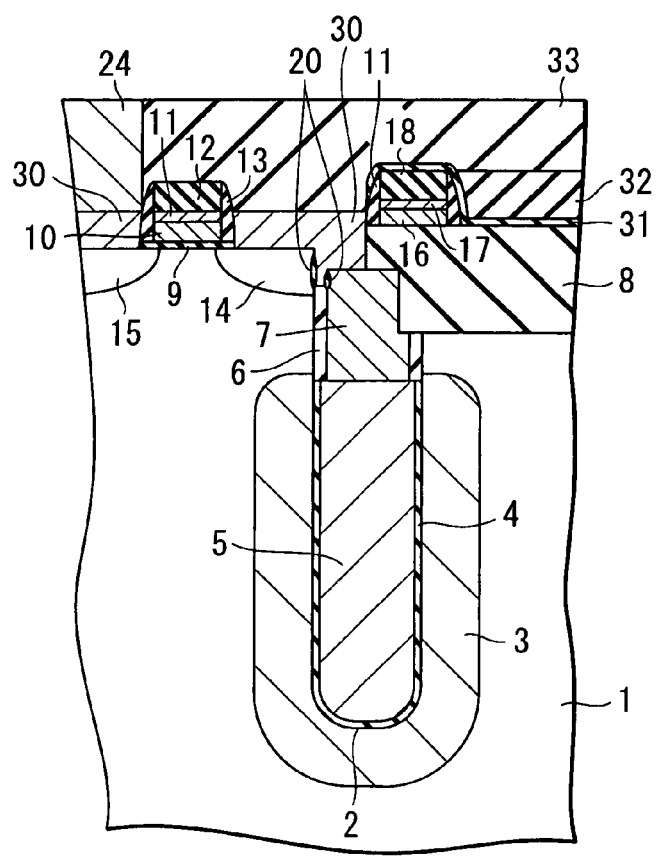
FIG. 19 is a cross-sectional view taken along the I—I line of a semiconductor device according to a second embodiment of the present invention.
Figure 20:
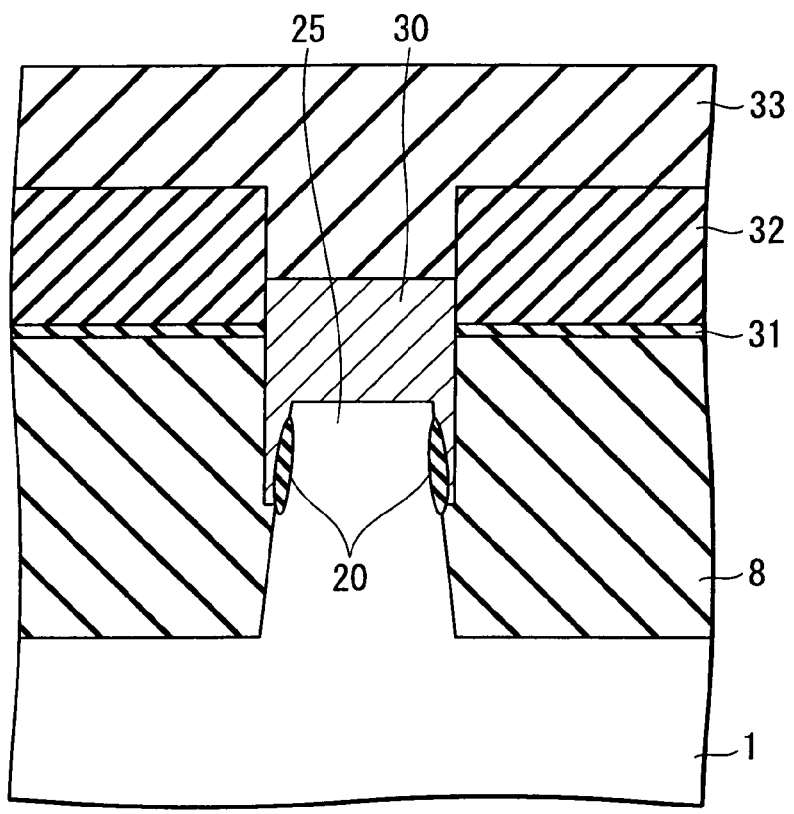
FIG. 20 is a cross-sectional view taken along the II—II line of the semiconductor device according to the second embodiment of the present invention.

FIG. 19 is a cross-sectional view of a semiconductor memory device according to a second embodiment of the present invention. The cross-sectional view is taken along the same position as that of the I—I line of FIG. 1. FIG. 20 is a cross-sectional view of the semiconductor memory device of the second embodiment, taken along the same position as that of the II—II line of FIG. 1.

Thermal oxide films 20 are formed on a side surface of a trench 2 located on the color oxide film 6, a side surface of a polysilicon layer 7 located on the color oxide film 6, and both side surfaces of an active region 25 located on an element-isolating region 8. A SS contact layer 30 being a contact layer between the polysilicon layer 7 and a source diffusion layer 14 is provided on the polysilicon layer 7 and the active region 25. The SS contact layer 30 is formed by burying, for example, As-doped amorphous silicon. An SS contact layer 30 is also formed on the drain diffusion layer 15. The element-isolating region 8 is provided around the surface of the semiconductor substrate 1, to electrically separate the element from an adjacent element.

A barrier film 31 formed of SiN or the like is provided on the element-isolating region 8. A first interlayer film 32 formed of BPSG or the like is provided on the barrier film 31. A second interlayer film 33 formed of TEOS or the like is provided on the first interlayer film 32 and the SS contact layer 30. Thereby, the semiconductor memory device shown in FIG. 19 is structured.

Next, a manufacturing method of the semiconductor memory device shown in FIG. 19 is explained with reference to FIGS. 21 to 30.

FIGS. 21, 23, 25, 27 and 29 are cross-sectional views taken along the I—I line in FIG. 1. FIGS. 22, 24, 26, 28 and 30 are cross-sectional views taken along the II—II line in FIG. 1. The manufacturing method of the second embodiment also includes the same steps to FIGS. 7 and 8 of the first embodiment.

Figure 22:
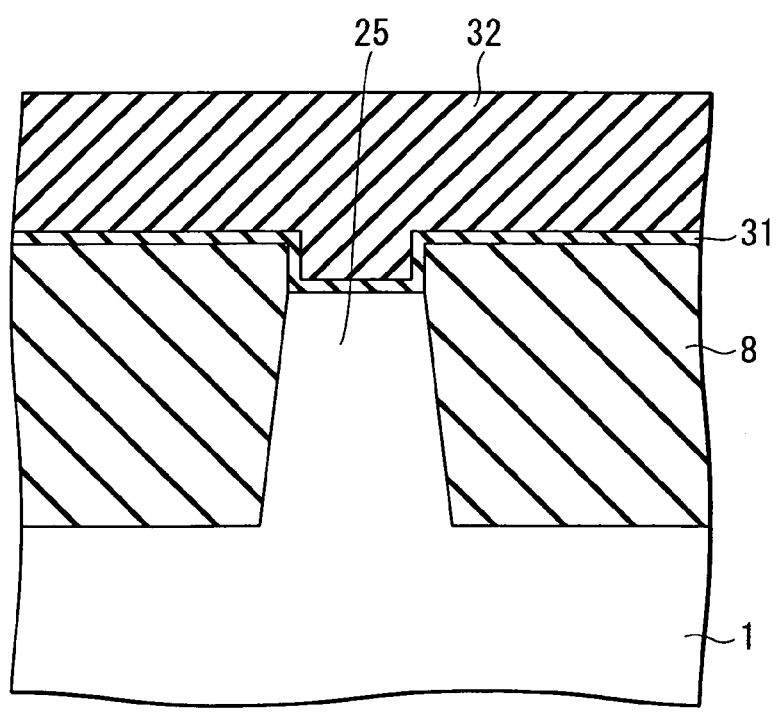
FIG. 22 is a cross-sectional view taken along the II—II line for explaining a manufacturing method of the semiconductor memory device shown in FIG. 20.
Figure 21:
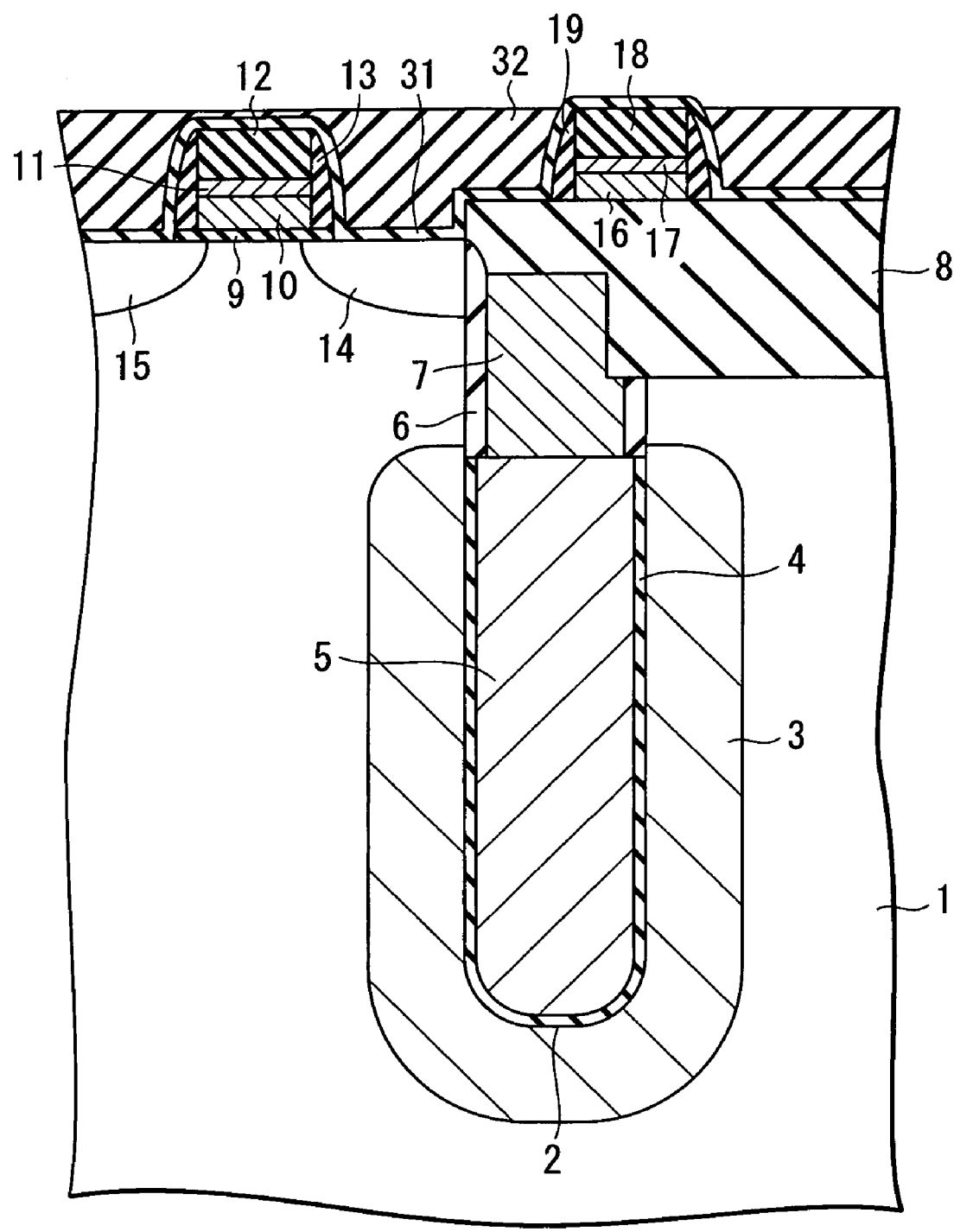
FIG. 21 is a cross-sectional view taken along the I—I line for explaining a manufacturing method of the semiconductor memory device shown in FIG. 19.

In FIGS. 21 and 22, the barrier film 31 (film thickness of about 80 Å) formed of SiN is deposited on the whole surface of the semiconductor substrate 1. The first interlayer film 32 (film thickness of about 3700 Å) formed of BPSG is deposited on the barrier film 31, and the surface thereof is planarized by CMP.

Figure 23:
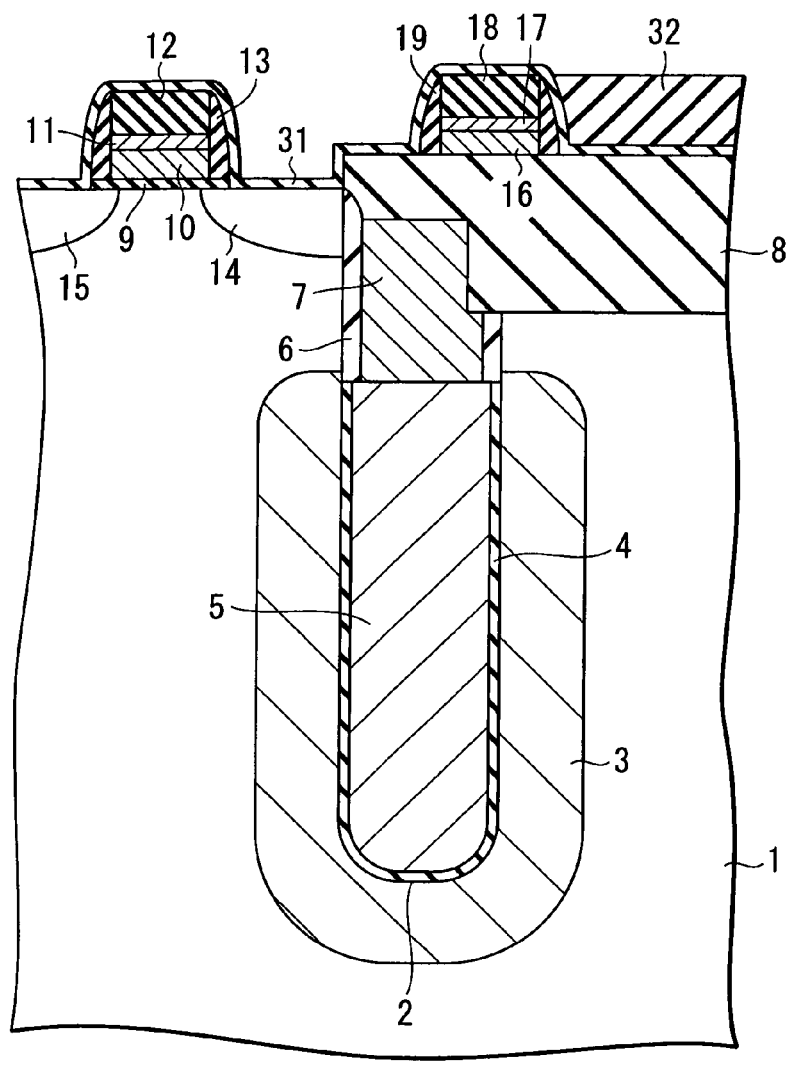
FIG. 23 is a cross-sectional view taken along the I—I line for explaining the manufacturing method, following FIG. 21.
Figure 24:
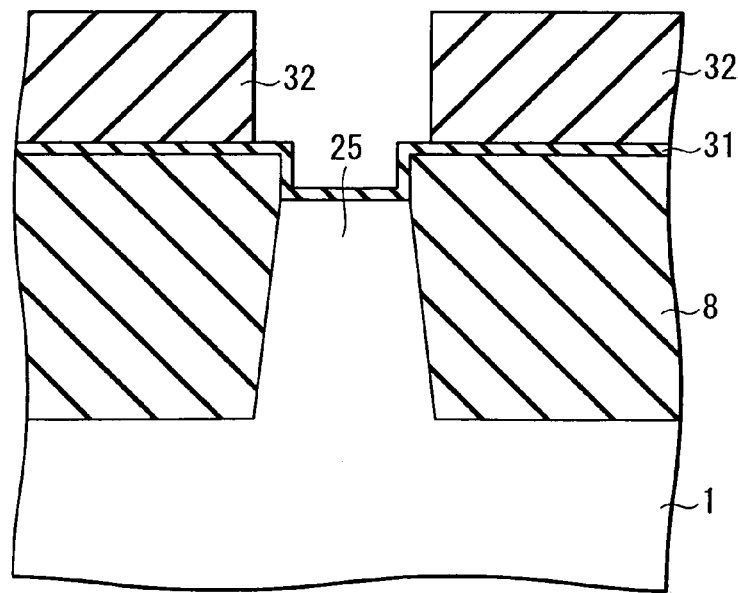
FIG. 24 is a cross-sectional view taken along the II—II line for explaining the manufacturing method, following FIG. 22.

Next, in FIGS. 23 and 24, a photoresist is formed by photolithography to remove the first interlayer film 32 on a region in which the SS contact layer 30 is to be formed, and the first interlayer film 32 is etched by RIE with the photoresist used as a mask.

Figure 25:
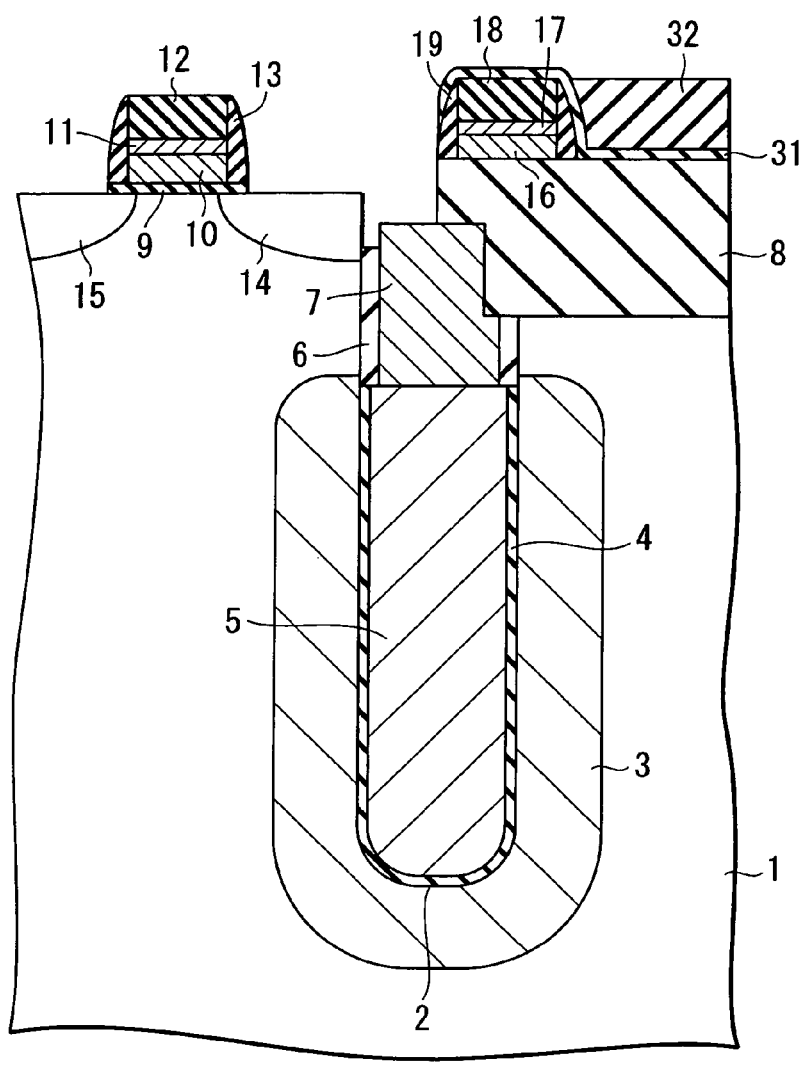
FIG. 25 is a cross-sectional view taken along the I—I line for explaining the manufacturing method, following FIG. 23.
Figure 26:
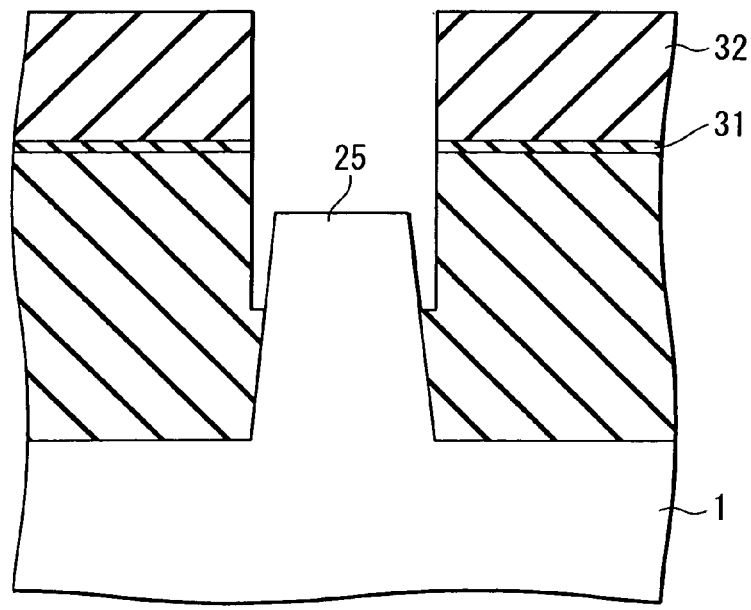
FIG. 26 is a cross-sectional view taken along the II—II line for explaining the manufacturing method, following FIG. 24.

Next, in FIGS. 25 and 26, the barrier film 31 located on opening portions for the SS contact layer 30 is etched by RIE, with the first interlayer 32 used as a mask. Further, a TTO being an oxide film formed on an upper portion of the trench capacitor (specifically, polysilicon layer 7) is removed by etching. In this removal, over etching is performed, in consideration of positional variations in the level of the upper portion of the polysilicon layer 7 and variations in the film thickness of the TTO. As shown in FIG. 26, the element separation region 8 on the side surfaces of the active region 25 is etched by TTO etching to a position of the same level as that of the upper surface of the color oxide film 6.

Figure 27:
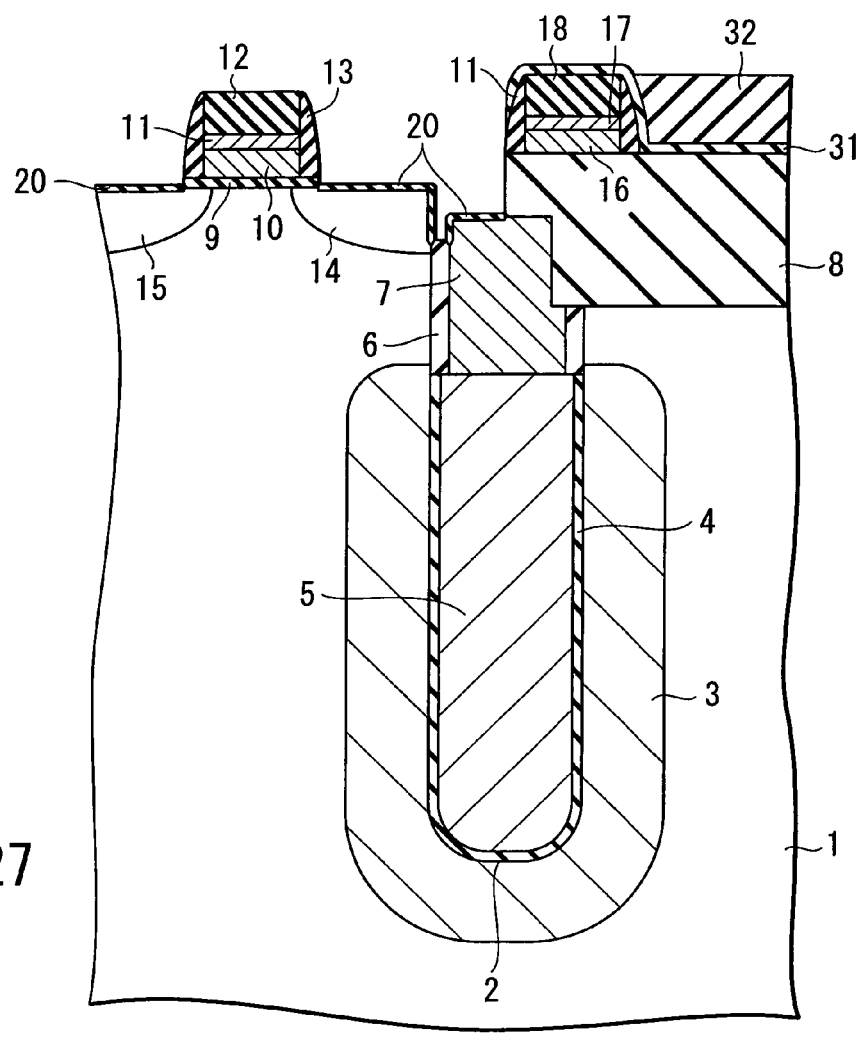
FIG. 27 is a cross-sectional view taken along the I—I line for explaining the manufacturing method, following FIG. 25.
Figure 28:
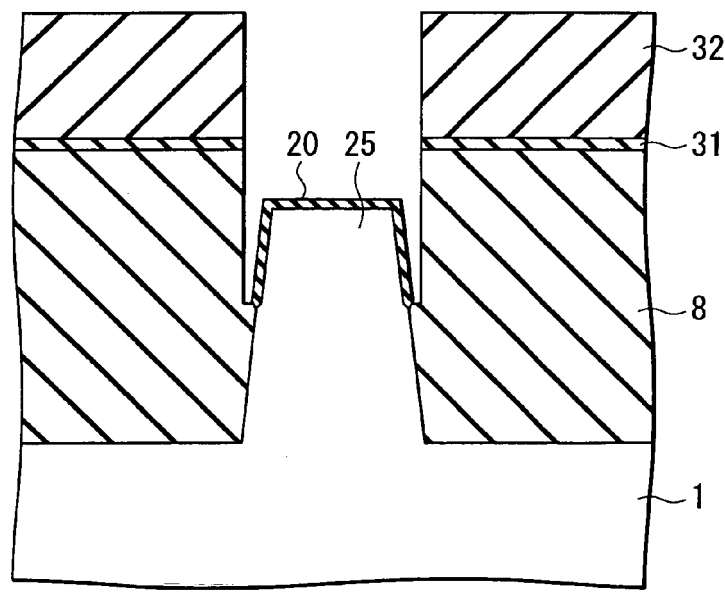
FIG. 28 is a cross-sectional view taken along the II—II line for explaining the manufacturing method, following FIG. 26.

Next, in FIGS. 27 and 28, the semiconductor substrate 1 is oxidized by thermal oxidation (for example, at 900° C., atmosphere $O_2$) Thereby, thermal oxide films 20 (film thickness of about 100 Å) are selectively formed only on silicon-exposed portions of the side surfaces of the active region 25, the surface of the semiconductor substrate 1 and the upper portion of the polysilicon layer 7.

Figure 29:
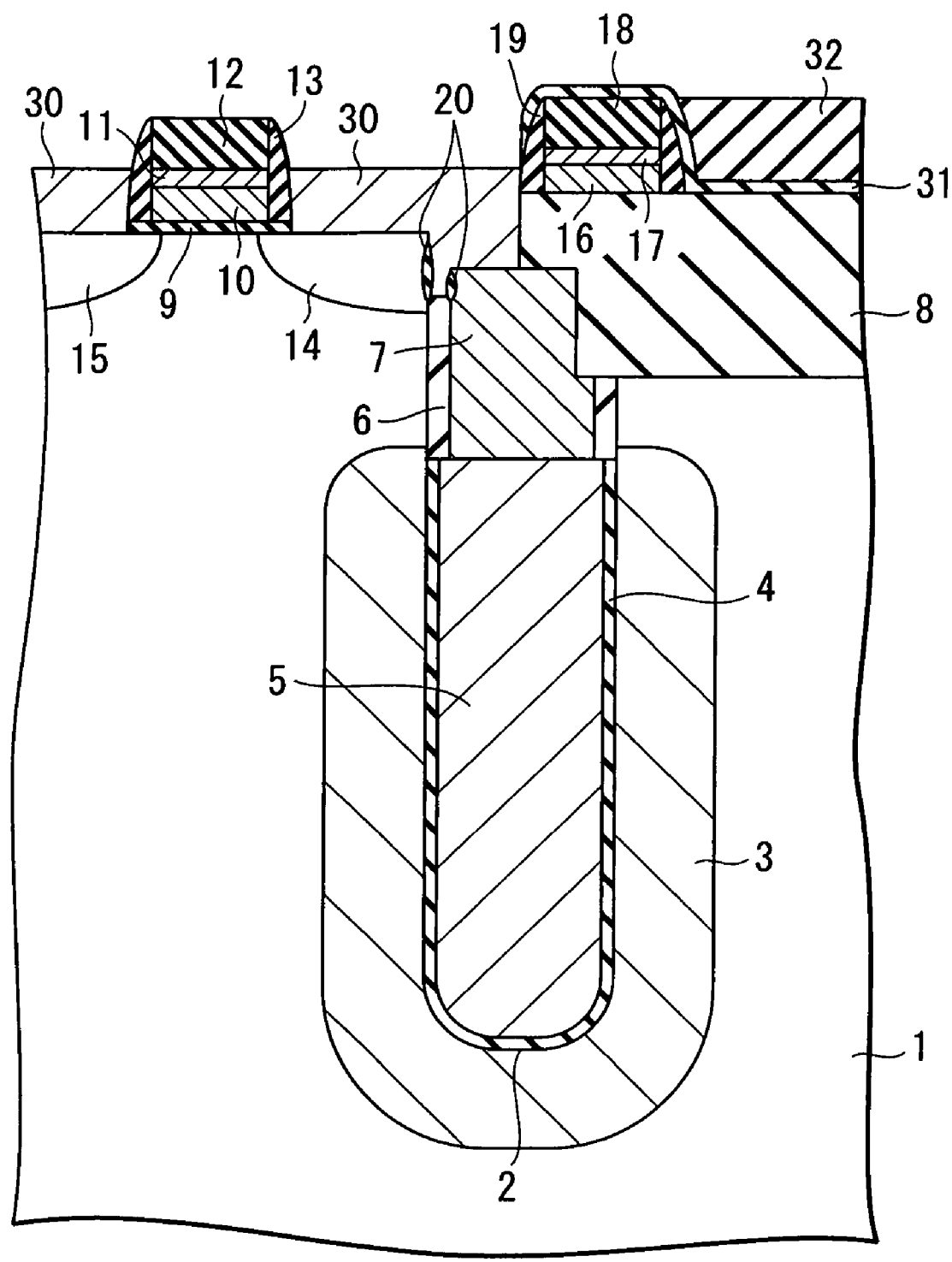
FIG. 29 is a cross-sectional view taken along the I—I line for explaining the manufacturing method, following FIG. 27.
Figure 30:
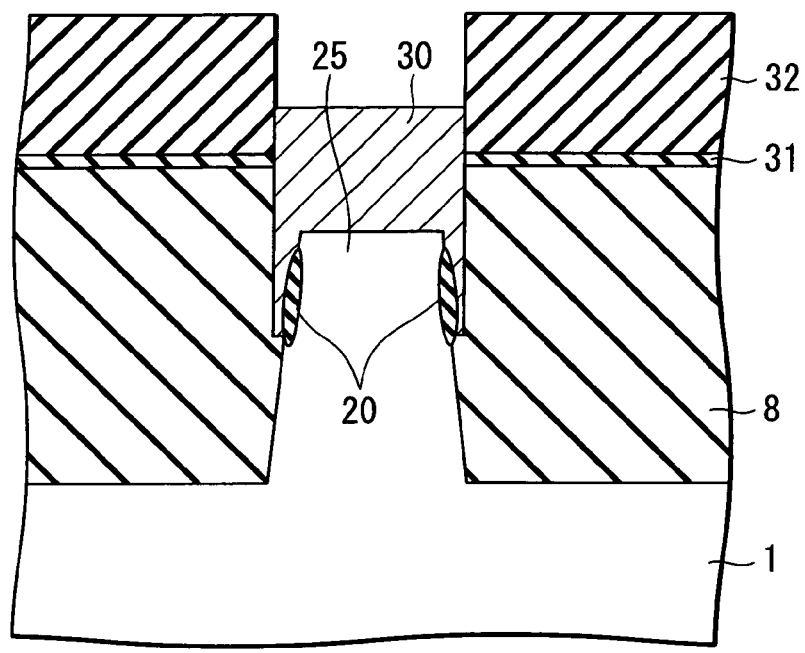
FIG. 30 is a cross-sectional view taken along the II—II line for explaining the manufacturing method, following FIG. 28.
Figure 31:
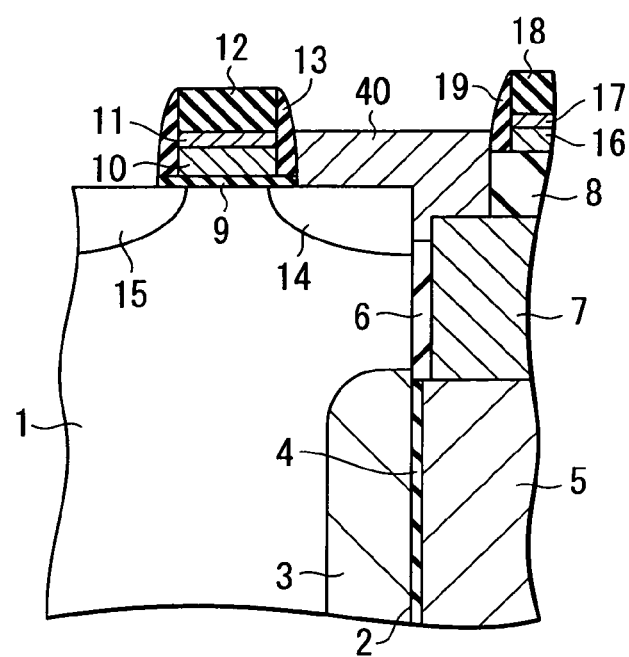
FIG. 31 is a cross-sectional view of a main part of a conventional DRAM.

Next, in FIGS. 29 and 30, the thermal oxide films 20 on the surface of the semiconductor substrate 1 are removed by anisotropic etching such as RIE (Reactive Ion Etching). In this removal, the thermal oxide films 20 on the side surfaces of the active region 25 are not etched but remain. Next, the natural oxide film on the surface of the semiconductor substrate 1 and the upper portion of the polysilicon layer 7 is removed. Next, As-doped amorphous silicon (SS contact layer 30) is deposited on the polysilicon layer 7 and the source diffusion layer 14. The step of removing the natural oxide film is not necessarily required if the semiconductor substrate 1 and the SS contact layer 30 are in ohmic contact. If the natural oxide film is removed by using a chemical solution such as dilute hydrofluoric acid, etching is performed under such conditions that the thermal oxide film 20 on the side surfaces of the active region 25 is not entirely removed (for example, etching amount of the thermal oxide films 20 is about 25 Å).

Then, the surface of the SS contact layer 30 is planarized by CMP (Chemical Mechanical Polishing), and the SS contact layer 30 is etched by RIE to a depth of about 500 Å (located as high as the middle portion of the gate cap insulating film 12) from the surface of the first interlayer film 23.

Next, as shown in FIGS. 19 and 20, the second interlayer film 33 (film thickness thereof on the first interlayer film is about 1500 Å) formed of TEOS is deposited on the whole surface of the semiconductor substrate 1 and planarized. Thereafter, a contact 24 being a contact with a bit line and contacts for peripheral circuits are formed, and further a wiring layer (not shown) is formed. By such a method, the semiconductor memory device shown in FIG. 19 is formed.

The semiconductor memory device structured as described above has the thermal oxide film 20 only on the side surfaces of the active region 25. Therefore, it can obtain the same effect as that in the first embodiment.

Further, the SS contact layer 30 can be formed as buried plugs. This can reduce the burden on the semiconductor device due to etching in formation of the SS contact layer 30.

Furthermore, even if position displacement occurs in the step of opening the first interlayer film 32 in the region for forming the SS contact layer 30, the barrier film 31 can prevent etching of the element-isolating region 8 on the side surfaces of the active region 25.

In this embodiment, the margin can be increased in the step of forming an opening in a region of the first internal film 32 for forming the SS contact layer 30. Specifically, even if a large part of the side surfaces of the active region 25 are exposed due to a position gap in photolithography, the thermal oxide films 20 can prevent diffusion of impurities from the SS contact layer 30 to the side surfaces of the active region 25.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate;
   an element region provided on the semiconductor substrate;
   an element-isolating region provided around the element region and on the semiconductor substrate;
   a trench provided in the semiconductor substrate, the trench contacting the element region;
   a capacitor having a first electrode provided in the semiconductor substrate and a second electrode provided in the trench;
   a first insulating film provided on a side surface of the trench and on the capacitor;

a first conductive layer provided on the first insulating film and the second electrode so as to bury the trench;

a second insulating film provided on a side surface of the trench and on the first insulating film, and provided on both side surfaces of the element region;

a gate electrode provided on the element region through a gate insulating film;

a source region and a drain region provided in the element region on both sides of the gate electrode; and a contact layer provided on the first conductive layer and the element region so as to connect the first conductive layer with the source region or the drain region.

2. The semiconductor memory device according to claim 1, the second insulating film formed of an oxide film.

3. The semiconductor memory device according to claim 2, the oxide film being a thermal oxide film.

4. The semiconductor memory device according to claim 1, further comprising side wall insulating films provided on side walls of the gate electrode, the side wall insulating films formed of an insulation material different from that of the second insulating film.

5. The semiconductor memory device according to claim 4, the side wall insulating films being formed of a nitride film.

6. The semiconductor memory device according to claim 1, wherein an upper surface of a part of the element-isolating region contacting the element region is lower than an upper surface of the element region.

7. The semiconductor memory device according to claim 1, wherein an upper surface of the first conductive layer is higher than an upper surface of the first insulating film.

8. The semiconductor memory device according to claim 1, wherein the second insulating film is in contact with the source region or the drain region.

9. The semiconductor memory device according to claim 1, wherein the semiconductor substrate is formed of silicon.

10. The semiconductor memory device according to claim 1, wherein the first conductive layer and the contact layer are formed of silicon doped with an impurity of a first conductivity type.

11. The semiconductor memory device according to claim 1, the capacitor comprising: a first diffusion layer for the first electrode, provided in the semiconductor substrate so as to be in contact with an inner surface of the trench; a capacitor insulating film provided on the diffusion layer exposed as the inner surface of the trench; and a conductive layer for the second electrode, provided on the capacitor insulating film so as to bury a lower portion of the trench.

* * * * *